US011581031B2

(12) United States Patent
Hiscock et al.

(10) Patent No.: US 11,581,031 B2
(45) Date of Patent: *Feb. 14, 2023

(54) MEMORY WITH PARTIAL BANK REFRESH (71) Applicant: Micron Technology, Inc., Boise, ID (US)

(72) Inventors: Dale H. Hiscock, Boise, ID (US);
Debra M. Bell, Boise, ID (US);
Michael Kaminski, Boise, ID (US);
Joshua E. Alzheimer, Boise, ID (US);
Anthony D. Veches, Boise, ID (US);
James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/338,191

(22) Filed: Jun. 3, 2021

(65) Prior Publication Data
US 2021/0295901 A1 Sep. 23, 2021

Related U.S. Application Data

(63) Continuation of application No. 16/693,949, filed on Nov. 25, 2019, now Pat. No. 11,062,755.

(51) Int. Cl.
*G11C 16/04* (2006.01)
*G11C 11/406* (2006.01)
*G11C 29/00* (2006.01)
*G11C 11/409* (2006.01)
*G11C 11/4074* (2006.01)

(52) U.S. Cl.
CPC ...... *G11C 11/40618* (2013.01); *G11C 11/409* (2013.01); *G11C 11/4074* (2013.01); *G11C 29/702* (2013.01)

(58) Field of Classification Search
CPC .......... G11C 11/40618; G11C 11/4074; G11C 11/409; G11C 29/702
See application file for complete search history.

(56) References Cited

U.S. PATENT DOCUMENTS

| | | | |
|---|---|---|---|
| 7,079,444 B2 | 7/2006 | Lee | |
| 7,969,807 B2 | 6/2011 | Hokenmaier et al. | |
| 8,817,549 B2 | 8/2014 | Shin et al. | |
| 8,848,462 B2 | 9/2014 | Luo et al. | |
| 9,076,548 B1 | 7/2015 | Park et al. | |
| 9,293,180 B2 | 3/2016 | Jeong et al. | |

(Continued)

*Primary Examiner* — Pho M Luu
(74) *Attorney, Agent, or Firm* — Perkins Coie LLP (57) ABSTRACT

Memory with partial bank refresh is disclosed herein. In one embodiment, a memory system includes a memory controller and a memory device operably connected to the memory controller. The memory device includes (i) a memory array having a memory bank with a plurality of memory cells arranged in a plurality of memory rows and (ii) circuitry. In some embodiments, the circuitry is configured to disable at least one memory row of the memory bank from receiving refresh commands such that memory cells of the at least one memory row are not refreshed during refresh operations of the memory device. In some embodiments, the memory controller is configured to track memory rows that include utilized memory cells and/or to write data to the memory rows in accordance with a programming sequence of the memory device.

20 Claims, 4 Drawing Sheets

(56) References Cited

U.S. PATENT DOCUMENTS

| | | |
|---|---|---|
| 9,767,050 B2 | 9/2017 | Doo et al. |
| 9,767,882 B2 | 9/2017 | Shin et al. |
| 10,141,042 B1 | 11/2018 | Richter |
| 10,762,946 B2 | 9/2020 | Hiscock et al. |
| 10,803,926 B2 | 10/2020 | Hiscock et al. |
| 10,978,134 B1 * | 4/2021 | Zheng ............... G11C 11/40611 |
| 11,062,755 B2 * | 7/2021 | Hiscock ............... G11C 29/702 |
| 11,380,382 B2 * | 7/2022 | Zhang ............... G11C 11/40603 |
| 2003/0028711 A1 | 2/2003 | Woo et al. |
| 2009/0225616 A1 | 9/2009 | Hokenmaier et al. |
| 2016/0071591 A1 | 3/2016 | Hsu |
| 2016/0267996 A1 | 9/2016 | Bushnaq et al. |
| 2020/0027512 A1 | 1/2020 | Yun et al. |
| 2020/0211626 A1 | 7/2020 | Hiscock et al. |
| 2020/0211636 A1 | 7/2020 | Hiscock et al. |
| 2020/0357461 A1 | 11/2020 | Hiscock et al. |
| 2020/0411081 A1 | 12/2020 | Hiscock et al. |

* cited by examiner

MEMORY WITH PARTIAL BANK REFRESH

CROSS-REFERENCE TO RELATED APPLICATIONS

This application is a continuation of U.S. patent application Ser. No. 16/693,949, filed Nov. 25, 2019, now U.S. Pat. No. 11,062,755; which is incorporated herein by reference in its entirety.

TECHNICAL FIELD

The present disclosure is related to memory systems, devices, and associated methods. In particular, the present disclosure is related to memory devices with partial memory bank refresh.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Memory devices such as DRAM may utilize refresh operations to keep data from being corrupted by, for example, charge leakage or other effects that can degrade data over time. Refresh operations can consume significant power, posing a challenge for systems in which power constraints are important, such as mobile devices, etc. Conventionally, refresh operations are directed to every portion of a memory device, in round-robin fashion, so that every portion of the memory device is refreshed within some predetermined time (e.g., at a specification-driven refresh rate). As memory devices are often not fully populated with valid data, however, this means memory portions where there is no risk of data degradation (e.g., due to the absence of any valid data) are unnecessarily subject to power-consuming refresh operations, constituting a waste of power.

Accordingly, as discussed in greater detail below, the technology disclosed herein relates to memory systems and devices with partial memory bank refresh control over memory regions in a memory array, and associated methods. In some embodiments, memory systems and devices disclosed herein are configured to track utilized memory rows of a memory bank (e.g., memory rows programmed with and/or storing non-stale data). In these and other embodiments, the memory systems and devices are configured to refresh only utilized memory rows in a memory bank. For example, the memory systems and devices can reduce memory row compression during refresh operations to reduce the number of rows activated during each refresh pump of the refresh operation. As another example, the memory systems and devices (e.g., inhibit circuitry of each memory bank) can mask unutilized memory rows from receiving refresh operations. Additionally, or alternatively, the memory systems and devices can reduce the number of issued refresh commands and/or can reduce the number of refresh pumps that activate memory rows during a refresh operation.

Therefore, the technology disclosed herein provides greater granularity and flexibility than conventional refreshing schemes. For example, partial array self refresh (PASR) is a conventional refresh operation where refresh operations are not performed across the full memory array. Instead, only specific memory banks of the memory array where data retention is required are refreshed. In contrast with embodiments of the present technology, however, PASR does not provide the granularity or flexibility of refreshing specific (e.g., individually selected, sub arrays of, etc.) memory rows within a memory bank. Furthermore, in contrast with embodiments of the present technology, PASR does not consolidate valid, non-stale data in logically or physically adjacent memory rows, nor does PASR track which memory rows within a memory bank contain valid, non-stale data. Thus, PASR refresh operations constitute a waste of power in that unused memory rows or memory rows storing stale data within a refreshed memory bank are refreshed. In addition, PASR is a self-refresh scheme. That is, it does not apply to auto or standard refresh schemes that refresh the entire memory array in round-robin fashion. In contrast, embodiments of the present technology apply to both self-refreshing and auto/standard refreshing schemes. As such, the present technology can reduce power consumption (e.g., by not refreshing memory rows containing stale data) and the amount of processing time or other resources consumed (e.g., by reducing the number of refresh commands issued) in comparison with conventional refreshing schemes, including PASR.

A person skilled in the art will understand that the technology may have additional embodiments and that the technology may be practiced without several of the details of the embodiments described below with reference to FIGS. 1-4. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

As used herein, the term "refresh" refers to various maintenance operations that can be performed on one or more memory cells of memory devices configured in accordance with various embodiments of the present technology. In some embodiments, the term "refresh" can refer to maintenance operations performed on one or more memory cells to maintain their data. For example, in the context of DRAM and other memory devices, the term "refresh" can refer to reading data from the one or more memory cells and rewriting the data to the one or more memory cells to increase the charge stored on the one or more memory cells to ameliorate charge leakage and to prevent data loss. In these and other embodiments, the term "refresh" can refer to reading data from the one or more memory cells and rewriting the data to the one or more memory cells in an inverted or other data state (e.g., from high to low or low to high), to ameliorate hysteresis shift, material depolarization, imprint and/or wear effects, or the like. In these and still other embodiments, the term "refresh" can refer to other maintenance operations, such as reading data from one or more memory cells and rewriting the data to one or more memory cells at another/other memory location(s).

Memory cells in a memory array of a memory device may be periodically refreshed to prevent data loss. For example, volatile memory devices, such as DRAM devices, may periodically refresh memory cells (e.g., by restoring charge levels programmed on the memory cells) to prevent data loss due to charge leakage. As discussed above, refreshing the memory cells, however, often consumes a large amount of input/output (IO) bandwidth and power of the memory device, which can be further increased as the number of memory cells and/or refresh rates of the memory cells in the memory devices are increased. Thus, in the event that less than all of the memory cells in a memory array of a memory device are fully utilized (e.g., programmed with and/or storing non-stale data), refreshing each of the memory cells in the memory array to refresh utilized memory cells results in refreshing junk data stored on unutilized memory cells and in a waste of power.

To address these concerns, several embodiments of the present technology are directed to memory devices, systems including memory devices, and methods of operating memory devices in which memory cells in a memory array of a memory device (e.g., memory rows of a memory bank) are programmed in accordance with a programming sequence to keep data consolidated. In some embodiments, a memory controller of the memory device and/or a host device operably connected to the memory device can track which memory regions (e.g., memory rows, memory columns, memory bank subarrays, memory banks, logical memory ranks or dies, etc.) include utilized memory cells. In these and other embodiments, refresh operations refresh only memory regions that contain utilized memory cells, thereby conserving power in relation to conventional refresh operations during which all memory regions and/or all memory regions of a memory bank are refreshed. In this manner, memory devices (and associated systems and methods) configured in accordance with various embodiments of the present technology can refresh only memory regions that are currently utilized, thereby saving power and IO bandwidth over conventional refreshing schemes.

Figure 1:
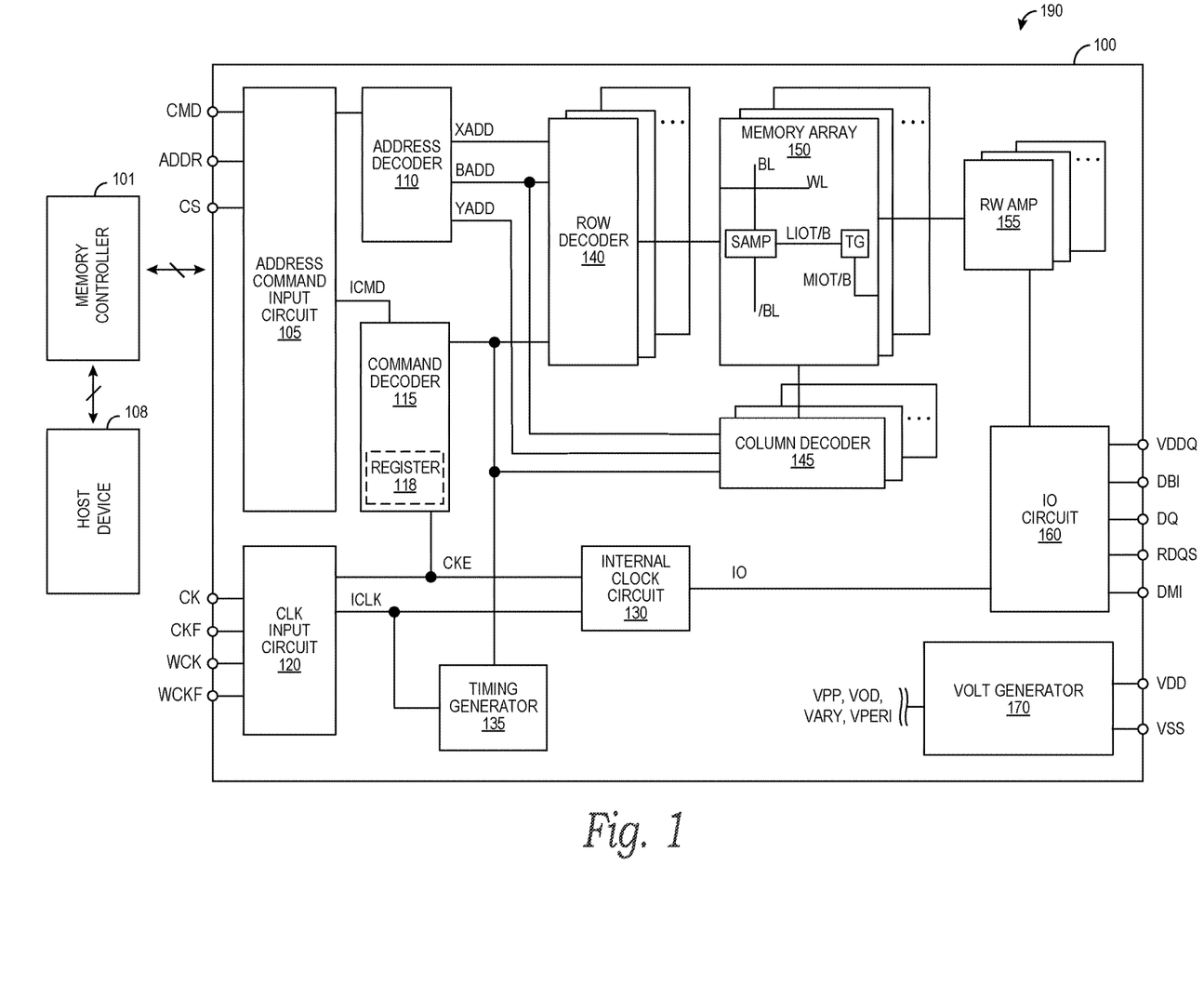
FIG. 1 is a block diagram schematically illustrating a memory system configured in accordance with various embodiments of the present technology.

FIG. 1 is a block diagram schematically illustrating a memory system 190 configured in accordance with an embodiment of the present technology. The memory system 190 can include a memory device 100 that can be connected to any one of a number of electronic devices that is capable of utilizing memory for the temporary or persistent storage of information, or a component thereof. For example, the memory device 100 can be operably connected to a host device 108 and/or to a memory controller 101. The host device 108 operably connected to the memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to the memory device 100, although in other embodiments, the host device 108 may be indirectly connected to the memory device 100 (e.g., over a networked connection or through intermediary devices, such as through the memory controller 101).

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, and VDDQ.

The power supply terminals of the memory device 100 may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in a row decoder 140, the internal potentials VOD and VARY can be used in sense amplifiers included in a memory array 150 of the memory device 100, and the internal potential VPERI can be used in many other circuit blocks.

The power supply terminals may also be supplied with power supply potential VDDQ. The power supply potential VDDQ can be supplied to an input/output (TO) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 160 so that power supply noise generated by the IO circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from a command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals (not shown) to the command decoder 115. The internal clock circuit 130 can further provide input/output (IO) clock signals. The IO clock signals can be supplied to the IO circuit 160 and can be used as a timing signal for determining an output timing of read data and the input timing of write data. The IO clock signals can be provided at multiple clock frequencies so that data can be output from and input into the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated that can be used by the command decoder 115, the column decoder 145, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells (e.g., half memory banks, subarrays in a memory bank, etc.). In these and other embodiments, the memory regions of the memory array 150 can be arranged in one or more groups (e.g., one or more groups of memory banks, one or more logical memory ranks or dies, etc.). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also extract a bank address signal (BADD) and supply it to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown) to the command decoder 115. The command decoder 115 may further include one or more registers 118 for tracking various counts or values (e.g., counts of refresh commands received by the memory device 100 or self-refresh operations performed by the memory device 100; memory regions enabled for refresh operations; a last programmed and/or next-to-be programmed memory cell, memory row, memory column, memory bank, logical memory rank or die, and/or other memory region; etc.).

When a read command is issued, and a column address is timely supplied with the read command, read data can be read from memory cells in the memory array 150 designated by these row address and column address. The read command may be received by the command decoder 115, which can provide internal commands to the IO circuit 160 so that read data can be output from the data terminals DQ, RDQS, DBI, and DMI via read/write (RW) amplifiers 155 and the IO circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a column address is timely supplied with the command, write data can be supplied to the data terminals DQ, DBI, and DMI according to the WCK and WCKF clock signals. The write command may be received by the command decoder 115, which can provide internal commands to the IO circuit 160 so that the write data can be received by data receivers in the IO circuit 160, and supplied via the IO circuit 160 and the RW amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

As described in greater detail below, when a write command is issued, the column address supplied with the write command and an activated row can correspond to a programming sequence that defines a sequence of memory regions and/or locations (e.g., memory rows in a memory bank) to which the memory device 100 is configured to write new data. In this manner, data stored on the memory device 100 is consolidated on the memory device 100 and within each memory region at the time it is written to memory cells of the memory array 150. For example, the memory system 190 can write data to a memory bank of the memory array 150 in sequence, starting with memory cells in a first memory row. After (e.g., a threshold number of or any one of) the memory cells in the first memory row become utilized, the memory system 190 can proceed to write data to a next memory row (e.g., the next memory row in the memory bank, the next memory row in a same or next refresh pump as the previous memory row, etc.) in the programming sequence. In some embodiments, the programming sequence can correspond to an order in which memory rows of a memory region (e.g., a memory bank) are refreshed during refresh operations.

As data is written to memory cells of the memory array 150, the memory system 190 can track the last programmed or next-to-be programmed memory region and/or location (e.g., the last programmed or next-to-be programmed memory cell, memory row, memory column, memory bank, logical memory rank or die, etc.), such that data corresponding to a subsequent write command is written to the next-to-be programmed memory region and/or location and consolidates data stored on the memory array 150. In some embodiments, the memory system 190 can track the last programmed and/or the next-to-be programmed memory region and/or location using corresponding circuitry, such as one or more counters (e.g., a CBR counter), registers (e.g., the register 118), buffers, latches, embedded memories, etc., on the host device 108, on the memory controller 101, and/or on the memory device 100. In these and other embodiments, the corresponding circuitry can be reset in the event of power loss (e.g., powering down of the memory device 100) such that the memory system 190 is configured to write data to memory cells beginning at the first memory region and/or location in the programming sequence when the memory system 190 is subsequently powered on. In some embodiments, the programming sequence can be stored on the host device 108, on the memory controller 101, and/or on the memory device 100. In these and other embodiments, the programming sequence can be loaded into the host device 108, into the memory controller 101, and/or into the memory device 100 (e.g., as the memory system 190 is powered on).

The memory array 150 may be refreshed or maintained as described herein to prevent data loss, either due to charge leakage or imprint effects. A refresh operation, as described herein, may be initiated by the memory system 190 (e.g., by the host device 108, the memory controller 101, and/or the memory device 100), and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory device 100 may be configured to refresh the same row of memory cells in every memory bank of the memory array 150 simultaneously. In another approach, the memory device 100 may be configured to refresh the same row of memory cells in every memory bank of the memory array 150 sequentially. In still another approach, the memory device 100 can further include circuitry (e.g., one or more registers, latches, embedded memories, counters, etc.) configured to track row (e.g., word line) addresses, each corresponding to one of the memory banks in the memory array 150. In this approach, the memory device 100 is not constrained to refresh the same row in each memory bank of the memory array 150 before refreshing another row in one of the memory banks.

Regardless of the refresh approach, the memory device 100 can be configured to refresh memory cells in the memory array 150 within a given refresh rate or time window (e.g., 32 ms, 28 ms, 25 ms, 23 ms, 21 ms, 18 ms, 16 ms, 8 ms, etc.), known as tREF. In these embodiments, the memory system 190 can be configured to supply refresh commands to the memory device 100 in accordance with a specified minimum cadence tREFI. For example, the memory system 190 can be configured to supply one or more refresh commands to the memory device 100 at least every 7.8 µs such that an approximate minimum of 4000 refresh commands are supplied to the memory device 100 within a 32 ms time window.

In response to each refresh command, the memory device 100 can activate more than one memory row in parallel by compressing memory row addresses into a single refresh pump. Additionally, or alternatively, the memory device 100 can fire more than one refresh pump in response to each refresh command received from a host device or memory controller. In one embodiment, a CBR counter increments through, compresses, and/or pumps addresses of memory rows in the memory array 150 and/or in a memory bank of the memory array 150.

As explained above, refreshing memory cells in the memory array 150 can consume a large amount of TO bandwidth and power, especially as the number of memory cells and/or the refresh rates increase, and/or the specified minimum cadence tREFI decreases. In addition, it is unlikely that every memory cell in the memory array 150 and/or memory bank is utilized (e.g., is programmed with and/or is storing non-stale data) at any given time. Thus, refreshing every memory cell in the memory array 150 and/or memory bank during each refresh operation (as is performed during conventional refresh operations) results in refreshing memory cells that are not utilized and/or contain junk data, which constitutes a waste of TO bandwidth and/or power.

Figure 2:
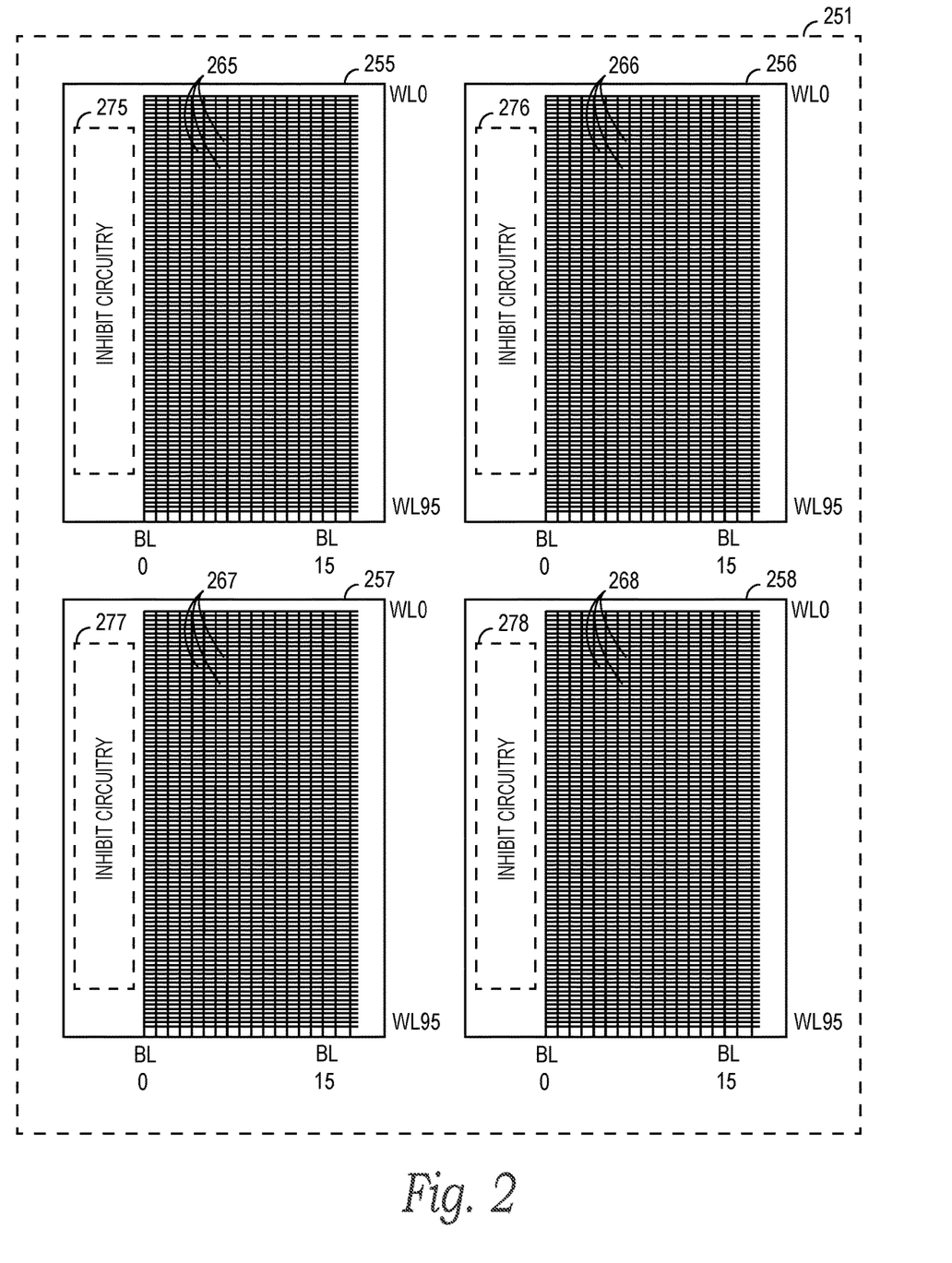
FIG. 2 is a block diagram schematically illustrating a memory bank region in a memory array of the memory device illustrated in FIG. 1.

FIG. 2 is a diagram schematically illustrating a memory bank group 251 in the memory array 150. As shown, the memory bank group 251 includes four memory banks 255-258 that each have a plurality of memory rows (e.g., word lines) WL0-WL95 and a plurality of memory columns (e.g., bit lines) BL0-BL15. Each of the memory banks 255-258 further include memory cells 265-268, respectively, at intersections of the respective memory rows WL0-WL95 and memory columns BL0-BL15.

The memory banks 255-258 of the memory bank group 251 illustrated in FIG. 2 further include inhibit circuitry 275-278 that are each operably connected to a respective memory bank 255-258. Although each memory bank 255-258 in the bank group 251 is illustrated with inhibit circuitry, a memory bank group in other embodiments can include inhibit circuitry positioned at other locations on the memory system 190, such as at other locations on the memory device 100 (e.g., inside or outside of the memory array 150, on and/or spread across one or more memory banks of the memory array 150 in addition to or in lieu of the memory banks 255-258, etc.), on the memory controller 101, and/or on the host device 108. In some embodiments, the memory system 190 can include inhibit circuitry shared by two or more memory banks and/or memory bank groups. For example, a memory bank group can include inhibit circuitry shared amongst all or a subset of the memory banks of the memory bank group. The inhibit circuitry 275-278 can include various hardware and/or software components, such as latches, registers, counters, control gates, and/or combinational logic (e.g., to track utilized memory cells).

In some embodiments, the inhibit circuitry (e.g., the inhibit circuitry 275) can be used by the memory system 190 to enable and/or disable (e.g., by default or until the memory bank 255 and/or memory rows register an activate) one or more memory rows of a memory bank (e.g., the memory bank 255) from receiving refresh commands. For example, inhibit circuitry (e.g., the inhibit circuitry 275 of memory bank 255) can disable memory rows of the memory bank 255 from being refreshed by masking unutilized memory rows of the memory bank 255 during refresh operations of the memory device 100. In these embodiments, the inhibit circuitry 275 can mask individual memory rows (e.g., by masking lower order row addresses of a memory row or memory rows), and/or the inhibit circuitry 275 can mask groups of memory rows (e.g., by masking upper order row addresses to mask sub arrays of memory rows within a memory bank and/or a memory bank group). While a memory row is disabled, the inhibit circuitry 275 can prevent the memory bank 255 from refreshing the memory cells of the memory row in response to receiving a refresh command from the memory system 190. In this manner, power that would otherwise be consumed by the memory device 100 to refresh the unutilized memory rows and/or memory cells is saved.

In these and other embodiments, the inhibit circuitry 275 can disable memory rows of the memory bank 255 from being refreshed by reducing row compression and/or by reducing the number of refresh pumps fired in response to each refresh command. As a specific example, consider a memory bank having 256,000 memory rows. To maintain a 32 ms refresh rate using a conventional refresh approach, a refresh command must be issued every 7.8 µs, and each refresh operation must activate and refresh 64 memory rows of the memory bank. To refresh the 64 memory rows under the conventional approach, the memory device fires four refresh pumps by compressing row address terms to activate and refresh 16 memory rows in parallel. For example, memory row address bits 17:14 are compressed such that memory rows are activated and refreshed for each state (e.g., "0" and "1") of these address bits during a fired pump. Thus, in this example, a refresh pump is fired in response to each state change of memory row address bits 13 and 12 (e.g., a first pump is fired when RA[13:12]=00, a second pump is fired when RA[13:12]=01, a third pump is fired when RA[13:12]=10, and a fourth pump is fired when RA[13:12]=11).

When less than all of the 256,000 memory rows of the memory bank are utilized, refreshing unutilized memory rows constitutes a waste of power. Thus, memory devices 100 (e.g., inhibit circuitry of a memory bank or memory bank group) configured in accordance with embodiments of the present technology can reduce row compression to reduce the number of memory rows activated during each refresh pump of a refresh operation. Using the above example, the memory device can reduce row compression to row address bits 17:15 rather than row address bits 17:14, which decreases the number of memory rows activated and refreshed in parallel per refresh pump from 16 memory rows down to 8 memory rows. Further reducing row compression corresponds to a further reduction in the number of memory rows activated and refreshed in parallel per refresh pump (e.g., further reducing row compression to row address bits 17:16 further reduces the number of memory rows activated and refreshed in parallel down to 4 memory rows per refresh pump).

Memory devices 100 (e.g., inhibit circuitry of a memory bank or memory bank group) configured in accordance with embodiments of the present technology can additionally or alternatively reduce the number of refresh pumps that are fired per refresh command. For example, instead of firing a refresh pump in response to each state change of memory row address bits 13 and 12, a memory device 100 of the present technology can fire a refresh pump in response to each state change of only memory row address bit 13 (or another row address bit). In this example, the memory device 100 would fire a first refresh pump in response to a first state change of memory row address bit 13 (e.g., a change from state "0" to state "1") and a second refresh pump in response to a second state change of memory row address bit 13 (e.g., a change from state "1" to state "0"). In these and other embodiments, the memory device 100 can fire a refresh pump in response to other events, such as a state change of a memory row address bit in one direction but not the other. As an example, the memory device 100 can (i) fire a refresh pump when memory row address bit 13 changes from state "0" to state "1" and (ii) not fire a refresh pump when memory row address bit 13 changes from state "1" to state "0." In this manner, the memory device 100 can implement an odd number of refresh pumps per refresh command.

In these and still other embodiments, the memory device 100 can maintain the same row compression during refresh while reducing the number of refresh commands required to refresh utilized memory rows of the memory array 150 (e.g., of each memory bank, memory bank group, etc.). For example, the memory device 100 can increase the specified minimum refresh cadence tREFI (e.g., thereby issuing fewer refresh commands) while still meeting the given refresh rate or time window tREFI for utilized memory rows of the memory array 150. Returning to the above example, if only half of the 256,000 memory rows of the memory bank are utilized, the specified minimum cadence tREFI can be increased from 7.8 µs to 15.6 µs (which corresponds to issuing half the number of refresh commands) to maintain the 32 ms refresh rate. In turn, the memory device 100 can offer increased bandwidth and process more data because the memory device 100 issues fewer refresh commands freeing the memory device 100 up for other operations.

In some embodiments, as the memory cells 265 of the memory bank 255 are programmed or are otherwise utilized (e.g., used to store non-stale data), the memory system 190 can use the inhibit circuitry 278 to enable memory rows of the memory bank 255 (e.g., after the memory rows and/or the memory bank 255 register an activate) corresponding to the utilized memory cells 265 to receive refresh operations. While a memory row is enabled, the memory bank 255 can refresh the memory cells 265 of the memory row in response to receiving a refresh command from the memory system 190. In these and other embodiments, when the memory cells 265 of the memory row are no longer utilized (e.g., the memory cells 265 are erased, are no longer programmed, and/or are programmed with stale data), the memory system 190 can use the inhibit circuitry 278 to disable the memory row from being refreshed during refresh operations.

In some embodiments, when memory cells of a memory bank are programmed or are otherwise utilized, the memory system 190 can track whether data stored on the memory cells is valid or non-stale. For example, the memory device 100 can include one or more timers (e.g., a timer per memory row, per group of memory rows, etc.) configured to track a duration of time data has been stored on memory cells of a memory row and/or a duration of time since the data has last been accessed or otherwise manipulated. In these embodiments, when the tracked duration of time(s) reach a threshold duration, the memory device 100 can designate the data as stale. The memory device 100 can then proceed to disable the memory row from receiving refresh operations; reconsolidate valid, non-stale data in the memory region containing the memory row; and/or overwrite the stale data with valid, non-stale data. Additionally, or alternatively, the memory controller 101 and/or the host device 108 of the memory system 190 can track whether data stored on the memory cells is valid or non-stale. In these embodiments, the memory controller 101 and/or the host device 108 can communicate with the memory device 100 to inform the memory device when the data is valid/non-stale and/or when the data is invalid/stale.

As discussed above, data can be programmed to memory rows of the memory array 150 (e.g., of a memory bank) according to a programming sequence. In some embodiments, the programming sequence can correspond to row compression and/or to refresh pumps of the memory device 100 such that the memory device 100 refreshes utilized memory rows storing programmed, non-stale data and does not refresh all or a subset of unutilized memory rows in a memory array 150 and/or in a memory bank. In this manner, the memory device 100 can remove refresh masks, can expand row compression, can increase the number of refresh pumps per refresh command, and/or can decrease the specified minimum refresh cadence tREFI as a greater number of memory rows in a memory bank become utilized (e.g., are programmed). Additionally, or alternatively, the memory device 100 can implement refresh masks, reduce row compression, decrease the number of refresh pumps per refresh command, and/or increase the specified minimum refresh cadence tREFI as memory rows in a memory bank become unutilized (e.g., are unutilized by default, are erased, and/or data stored on memory rows becomes stale).

In some embodiments, each memory bank, memory bank group, and/or logical memory rank in the memory array 150 enables and disables memory rows from receiving refresh operations independent of other memory banks, memory bank groups, and/or logical memory ranks, respectively. Thus, rather than disabling entire memory banks, memory bank groups, and/or logical memory ranks from receiving refresh operations, the memory device 100 can continue to operate all banks in parallel despite not utilizing the entire memory array 150. In these embodiments, the memory device 100 can employ more than one programming sequence (e.g., a programming sequence per memory bank) and/or more than one refresh scheme (e.g., a first memory bank performing a first number of refresh commands, firing a first number of refresh pumps per command, activating and refreshing a first number of memory rows in parallel per refresh pump, and/or masking a first number of refresh rows; and a second memory bank performing a second number of refresh commands, firing a second number of refresh pumps per command, activating and refreshing a second number of memory rows in parallel per refresh pump, and/or masking a second number of refresh rows).

Figure 3A:
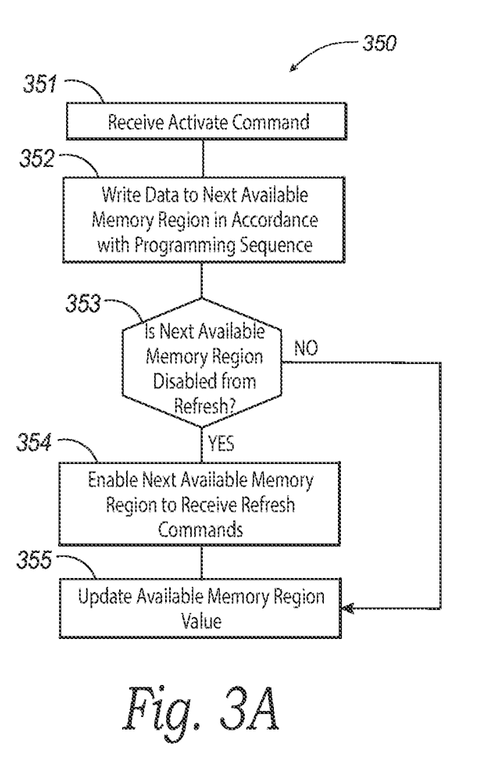
FIGS. 3A and 3B are flow diagrams illustrating various routines of a memory device and/or a memory system configured in accordance with various embodiments of the present technology.
Figure 3B:
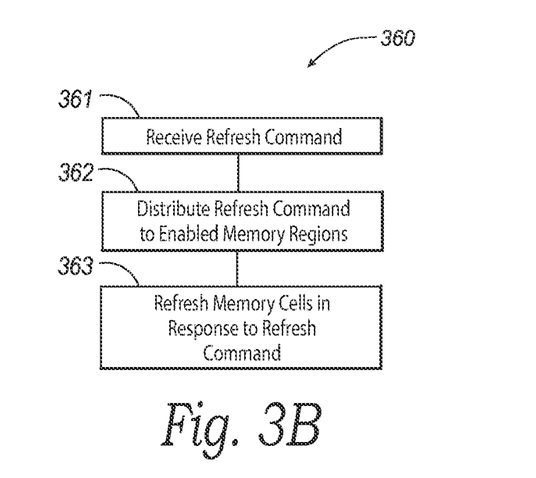

FIGS. 3A and 3B are flow diagrams illustrating various routines of a memory device configured in accordance with various embodiments of the present technology. In particular, FIG. 3A is a flow diagram illustrating a programming routine 350, and FIG. 3B is a flow diagram illustrating a refresh routine 360. In some embodiments, the routines 350 and/or 360 can be executed, at least in part, by the memory device, a memory controller operably connected to the memory device, and/or a host device operably connected to the memory controller and/or to the memory device. For example, the routines 350 and/or 360 can be carried out by a row decoder, inhibit circuitry, a CBR counter, a memory array, a memory row, a memory bank, and/or a logical memory rank or die. In these and other embodiments, all or a subset of the steps of the routines 350 and/or 360 can be performed by other components of the memory device (e.g., a command decoder), by components of the memory controller, by components of the host device, and/or by other components of a memory system containing the memory device.

Referring to FIG. 3A, the routine 350 can begin at block 351 by receiving an activate command. In some embodiments, the activate command can be issued by a host device and/or a memory controller operably connected to the memory device. In these and other embodiments, the activate command can be issued by the memory device and/or other components of the memory system.

At block 352, the routine 350 can write data to a next memory region (e.g., a next available memory region, such as a next available memory row) of the memory device in accordance with a programming sequence. The programming sequence can define an order of memory regions and/or locations (e.g., memory rows (word lines), memory columns (bit lines) memory banks, memory bank groups, logical memory ranks or dies, etc.) in the memory device to which the routine 350 sequentially writes data. In some embodiments, the programming sequence can be a predefined programming sequence (e.g., one defined during manufacture of and/or powering on of the memory device). For example, the programming sequence can correspond to an order and/or an extent (e.g., all of the memory rows, a subset of the memory rows, individual memory rows, etc.) in which memory rows are refreshed in a memory bank. In these and other embodiments, the programming sequence can be stored on the memory device and/or on other components of the memory system (e.g., on the host device and/or on the memory controller). In these and still other embodiments, the programming sequence can be loaded into the memory device, the memory controller, and/or the host device (e.g., when the memory device is powered on).

In some embodiments, the routine 350 can track the last programmed or next-to-be programmed memory region (e.g., memory row (word line), memory column (bit line), groups of memory rows and/or memory columns (e.g., sub arrays), memory bank, memory bank group, logical memory rank or die, etc.) in the programming sequence by storing a corresponding value on the memory device, on the memory controller, and/or on the host device. In these embodiments, the routine 350 can reference the programming sequence (e.g., the stored value) to determine one or more row and/or column addresses corresponding to the next available memory region, to supply the one or more row and/or column address corresponding to the next available memory region to the memory device, and/or to write data to memory cells of the next available memory region at the corresponding one or more row and/or column addresses. For example, after the memory device is powered on, the routine 350 can initially retrieve one or more row and column addresses corresponding to a first memory region (e.g., a first memory row in a first memory bank and/or logical memory rank or die in the memory device, a first memory row in a first memory bank in each memory bank group, etc.) in the programming sequence, supply the one or more row and column addresses corresponding to the first memory region in the programming sequence to the memory device, and/or write data to the first memory region in the programming sequence at memory locations corresponding to the one or more row and column addresses. As described in greater detail below with respect to block 355, the routine 350 can update the stored value to reflect the last programmed and/or the next-to-be programmed memory region such that the routine 350 can reference the stored value and write data to the next-to-be programmed memory region during a subsequent write operation.

At block 353, the routine 350 determines whether the next available memory region is disabled from receiving refresh commands. In some embodiments, the routine 350 can track and/or determine which memory regions are enabled and/or disabled from receiving refresh operations by using a table and/or other values stored on the memory device, on the memory controller, and/or on the host device. If the routine 350 determines the next available memory region is disabled from receiving refresh operations, the routine 350 can proceed to block 354. On the other hand, if the routine 350 determines that the next available memory region is not disabled from receiving refresh operations, the routine 350 can proceed to block 355.

At block 354, the routine 350 can enable the next available memory region to receive refresh commands. In some embodiments, the routine 350 can enable the next available memory region to receive refresh commands using inhibit circuitry corresponding to the next available memory region. In these and other embodiments, the routine 350 can enable the next available memory region to receive refresh commands by registering an activate of the next available memory region (e.g., with the host device, with the memory controller, and/or with the memory device). For example, memory regions in the memory device can be disabled from receiving refresh operations by default until memory cells on the next available memory region are utilized (e.g., are programmed with and/or store non-stale data). In these embodiments, the first time the routine 350 writes data to memory cells of the next available memory region, the routine 350 can register an activate of the next available memory region to enable the next available memory region to receive refresh commands. In these and still other embodiments, a memory region can be disabled from receiving refresh commands by masking the next available memory region from receiving refresh commands. In these embodiments, the routine 350 can enable the next available memory region to receive refresh commands by removing the mask from (e.g., by not masking) the next available memory region during refresh operations. In these and other embodiments, a memory region can be disabled from receiving refresh commands due to current refresh operation settings (e.g., row compression, pump scheme, and/or specified minimum cadence tREFI). In these embodiments, the routine 350 can enable the next available memory region to receive refresh command by adjusting refresh operations settings (e.g., of a memory bank). For example, the routine 350 can increase row compression, can increase the number of refresh pumps fired in response to each received refresh command, and/or can decrease the specified minimum cadence tREFI such that a greater number of refresh commands are provided.

At block 355, the routine 350 can update the stored value referenced at block 352 to reflect the last programmed or next-to-be programmed memory region (e.g., the last programmed or next-to-be programmed memory row). In this manner, the routine 350 can reference the updated value during a subsequent write operation and can write data to the memory device in accordance with the programming sequence such that data stored on the memory device is consolidated at the time it is written to the memory device. In some embodiments, the routine 350 can reset the stored value in the event of power loss to the memory device such that the routine 350 writes data to the first memory region (e.g., the first memory row) in the programming sequence after the stored value has been reset and the memory device is powered on.

Referring to FIG. 3B, the refresh routine 360 can begin at block 361 by receiving a refresh command. In some embodiments, the refresh command can be issued by a host device and/or a memory controller operably connected to the memory device. In these and other embodiments, the refresh command can be issued by the memory device and/or another component of the memory system.

At block 362, the routine 360 can distribute the refresh command to memory regions (e.g., to memory rows) of the memory device that are enabled to receive refresh commands. In some embodiments, the routine 360 can distribute the refresh command to enabled memory regions by individually sending a refresh command to each enabled memory region (e.g., to each enabled memory row). In other embodiments, the routine 360 can distribute the refresh command to enabled memory regions by masking disabled memory regions (e.g., using corresponding inhibit circuitry) from receiving a refresh command sent to all or a subset of the memory regions in the memory device. As an example, a memory bank can distribute a refresh command to every memory row in the memory bank, and inhibit circuitry of the memory bank can (a) mask disabled memory rows and/or groups of memory rows from receiving the refresh command and/or (b) distribute the refresh command only to enabled memory rows and/or groups of memory rows. In these and other embodiments, the routine 360 can distribute the refresh command to memory regions in accordance with current refresh operation settings (e.g., of a memory bank). For example, a memory bank can distribute a refresh command to memory rows in accordance with a specified minimum cadence tREFI, in accordance with current memory row address compression, and/or in accordance with the current number of refresh pumps fired in response to each refresh command.

At block 363, the routine 360 can refresh memory cells of memory regions that receive the refresh command(s). In some embodiments, the routine 360 can refresh the memory cells by accessing one or more rows (e.g., WL) of a memory region and discharging cells of the accessed row to a corresponding SAMP. While a row is opened (e.g., while the accessed word line is energized), the routine 360 can compare the voltage resulting from the discharged cell to a reference, and/or the routine 360 can write back a logic value (e.g., charge the cell) to a nominal value for the given logic state. In some cases, the write back process can increase the charge of the cell to ameliorate the discharge issues discussed above. In other cases, the write back process can invert the data state of the cell (e.g., from high to low or low to high), to ameliorate hysteresis shift, material depolarization or the like. In this manner, only memory cells of enabled memory regions are refreshed in response to a refresh command received at block 361.

Although the steps of the routines 350 and 360 are discussed and illustrated in a particular order, the methods illustrated by the routines 350 and 360 in FIGS. 3A and 3B, respectively, are not so limited. In other embodiments, the methods can be performed in a different order. In these and other embodiments, any of the steps of the routines 350 and/or 360 can be performed before, during, and/or after any of the other steps of the routines 350 and/or 360. Moreover, a person of ordinary skill in the relevant art will readily recognize that the illustrated methods can be altered and still remain within these and other embodiments of the present technology. For example, one or more steps of the routines 350 and/or 360 illustrated in FIGS. 3A and 3B, respectively, can be omitted and/or repeated in some embodiments. In these and other embodiments, one or more steps of the routines 350 and/or 360 can be combined to form one or more other routines of the memory device.

Figure 4:
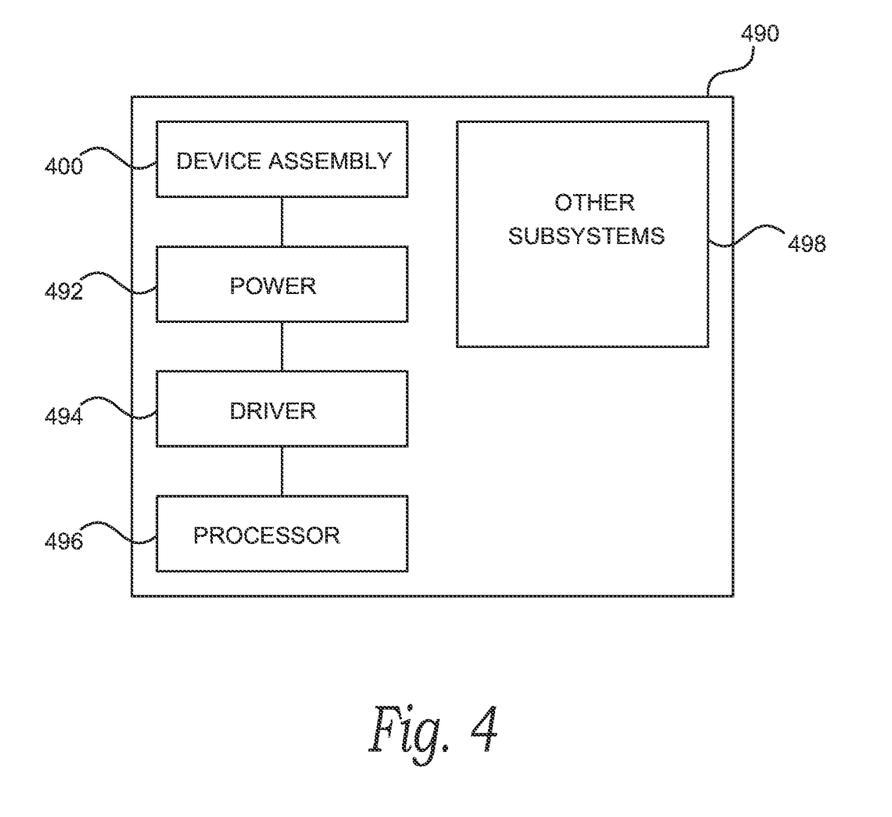
FIG. 4 is a schematic view of a system that includes a memory device configured in accordance with various embodiments of the present technology.

FIG. 4 is a schematic view of a system that includes a memory device in accordance with embodiments of the present technology. Any one of the foregoing memory devices described above with reference to FIGS. 1-3B can be incorporated into any of a myriad of larger and/or more complex systems, a representative example of which is system 490 shown schematically in FIG. 4. The system 490 can include a semiconductor device assembly 400, a power source 492, a driver 494, a processor 496, and/or other subsystems and components 498. The semiconductor device assembly 400 can include features generally similar to those of the memory device described above with reference to FIGS. 1-3B, and can, therefore, include various features of memory content authentication. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, vehicles, appliances, and other products. Components of the system 490 may be housed in a single unit or distributed over multiple, interconnected units (e.g., through a communications network). The components of the system 490 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. Circuitry configured to, during a refresh operation, disable a memory row of a memory region from receiving a refresh command such that memory cells of the memory row are not refreshed in response to the refresh command, wherein the refresh command is a command to refresh at least one memory row of the memory region including the memory row.

2. The circuitry of claim 1, wherein the circuitry is further configured to disable the memory row from receiving the refresh command by masking the memory row from the refresh command.

3. The circuitry of claim 1, wherein the circuitry is configured to disable the memory row from receiving the refresh command upon powerup of a memory device corresponding to the memory row or in response to a loss of power to the memory device.

4. The circuitry of claim 1, wherein the circuitry is configured to disable the memory row from receiving the refresh command when none of the memory cells of the memory row contain valid, non-stale data.

5. The circuitry of claim 1, wherein the circuitry is configured to disable the memory row from receiving the refresh command by reducing memory row address compression during a refresh operation executed in response to the refresh command.

6. The circuitry of claim 1, wherein the circuitry is configured to disable the memory row from receiving the refresh command by reducing a number of refresh pumps that are fired in response to the refresh command.

7. The circuitry of claim 1, wherein the circuitry is further configured to enable the memory row to receive a subsequent refresh command to refresh the at least one memory row such that the memory cells of the memory row are refresh in response to the subsequent refresh command.

8. The circuitry of claim 7, wherein the circuitry is configured to enable the memory row by unmasking the memory row.

9. The circuitry of claim 7, wherein the circuitry is configured to enable the memory row by increasing memory row address compression during a subsequent refresh operation executed in response to the subsequent refresh command.

10. The circuitry of claim 7, wherein the circuitry is configured to enable the memory row by increasing a number of pumps fired in response to the subsequent refresh command.

11. A method, comprising disabling a memory row of a memory region from receiving a refresh command such that memory cells of the memory row are not refreshed in response to the refresh command, wherein the refresh command is a command to refresh at least one memory row of the memory region including the memory row.

12. The method of claim 11, wherein disabling the memory row from receiving the refresh command includes masking the memory row from the refresh command.

13. The method of claim 11, wherein disabling the memory row from receiving the refresh command includes disabling the memory row from receiving the refresh command upon powerup of a memory device corresponding to the memory row or in response to a loss of power to the memory device.

14. The method of claim 11, wherein disabling the memory row from receiving the refresh command includes disabling the memory row from receiving the refresh command when none of the memory cells of the memory row contain valid, non-stale data.

15. The method of claim 11, wherein disabling the memory row from receiving the refresh command includes reducing memory row address compression during a refresh operation executed in response to the refresh command.

16. The method of claim 11, wherein disabling the memory row from receiving the refresh command includes reducing a number of refresh pumps that are fired in response to the refresh command.

17. The method of claim 11, further comprising enabling the memory row to receive a subsequent refresh command to refresh the at least one memory row such that the memory cells of the memory row are refresh in response to the subsequent refresh command.

18. The method of claim 17, wherein enabling the memory row includes unmasking the memory row.

19. The method of claim 17, wherein enabling the memory row includes (i) increasing memory row address compression during a subsequent refresh operation executed in response to the subsequent refresh command, and/or (ii) increasing a number of pumps fired in response to the subsequent refresh command.

20. A memory system, comprising:
a memory device; and
a host device configured to issue, to the memory device, a command to refresh at least one memory row of a memory region of the memory device,
wherein, in response to the command, the memory device is configured to (i) execute a refresh operation and (ii) disable, during the refresh operation, a memory row of the at least one memory row from receiving the refresh command such that memory cells of the memory row are not refreshed in response to the refresh command.

* * * * *